(12) United States Patent
Chuang

(10) Patent No.: US 11,152,506 B1
(45) Date of Patent: Oct. 19, 2021

(54) FINFET WITH LATERAL CHARGE BALANCE AT THE DRAIN DRIFT REGION

(71) Applicant: Texas Instruments Incorporated, Dallas, TX (US)

(72) Inventor: Ming-Yeh Chuang, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/901,798

(22) Filed: Jun. 15, 2020

(51) Int. Cl.
*H01L 29/78* (2006.01)
*H01L 29/08* (2006.01)
*H01L 27/088* (2006.01)
*H01L 29/40* (2006.01)

(52) U.S. Cl.
CPC ...... *H01L 29/7816* (2013.01); *H01L 27/0886* (2013.01); *H01L 29/402* (2013.01); *H01L 29/7851* (2013.01)

(58) Field of Classification Search
CPC . H01L 29/78; H01L 29/7816; H01L 29/7851; H01L 29/08; H01L 29/0886; H01L 29/402
USPC ........................................................ 257/335
See application file for complete search history.

(56) References Cited

U.S. PATENT DOCUMENTS

| | | | |
|---|---|---|---|
| 9,634,092 B2 | 4/2017 | Bhuwalka et al. | |
| 10,978,559 B1 * | 4/2021 | Haynie | H01L 29/7816 |
| 2007/0063261 A1 | 3/2007 | Chen et al. | |
| 2011/0006369 A1 | 1/2011 | Sonsky et al. | |
| 2014/0008733 A1 | 1/2014 | Shrivastava et al. | |
| 2017/0062609 A1 | 3/2017 | Logan et al. | |
| 2019/0279982 A1 | 9/2019 | Zhou et al. | |

OTHER PUBLICATIONS

Chen, et al., "RF power FinFET transistors with a wide drain-extended fin", pp. 04CR09-1 to 4, Japanese Journal of Applied Physics 56, 04CR09 (2017).
Luo, et al., "A Split Gate Power Finfet With Improved ON-Resistance and Switching Performance", pp. 1185-1188, IEEE Electron Device Letters, vol. 37, No. 9, Sep. 2016.

* cited by examiner

*Primary Examiner* — Fazli Erdem

(74) *Attorney, Agent, or Firm* — Jacqueline J. Garner; Charles A. Brill; Frank D. Cimino

(57) ABSTRACT

A semiconductor device includes an extended drain finFET. The drain drift region of the finFET extends between a drain contact region and a body of the finFET. The drain drift region includes an enhanced portion of the drain drift region between the drain contact region and the body. The drain drift region also includes a first charge balance region and a second charge balance region laterally adjacent to, and on opposite sides of, the enhanced portion of the drain drift region. The enhanced portion of the drain drift region and the drain contact region have a first conductivity type; the body, the first charge balance region, and the second charge balance region have a second, opposite, conductivity type. The drain drift region is wider than the body.

20 Claims, 14 Drawing Sheets

FINFET WITH LATERAL CHARGE BALANCE AT THE DRAIN DRIFT REGION

FIELD

This disclosure relates to the field of semiconductor devices. More particularly, but not exclusively, this disclosure relates to fin field effect transistors (finFETs) in semiconductor devices.

BACKGROUND

Fin field effect transistors (finFETs) are a type field effect transistor in which the body is located in a fin of semiconductor material. The gate wraps around the body on at least three sides of the fin. FinFETs are commonly used in "low voltage" circuits, such as logic circuits, in which the operating potential applied to the drains is less than the breakdown potential of the gate dielectric layer between the gate and the body. Forming finFETs which can be operated with drain potentials above the breakdown potential of the gate dielectric has been challenging.

SUMMARY

The present disclosure introduces a semiconductor device including an extended drain finFET, hereinafter the finFET. The finFET includes a drain drift region between a drain contact region of the finFET and a body of the finFET. The drain drift region includes an enhanced portion of the drain drift region between the drain contact region and the body. The finFET further includes a first charge balance region and a second charge balance region laterally adjacent to, and on opposite sides of, the enhanced portion of the drain drift region. The enhanced portion of the drain drift region and the drain contact region have a first conductivity type. The body, the first charge balance region, and the second charge balance region have a second, opposite, conductivity type.

DETAILED DESCRIPTION

Figure 1A:
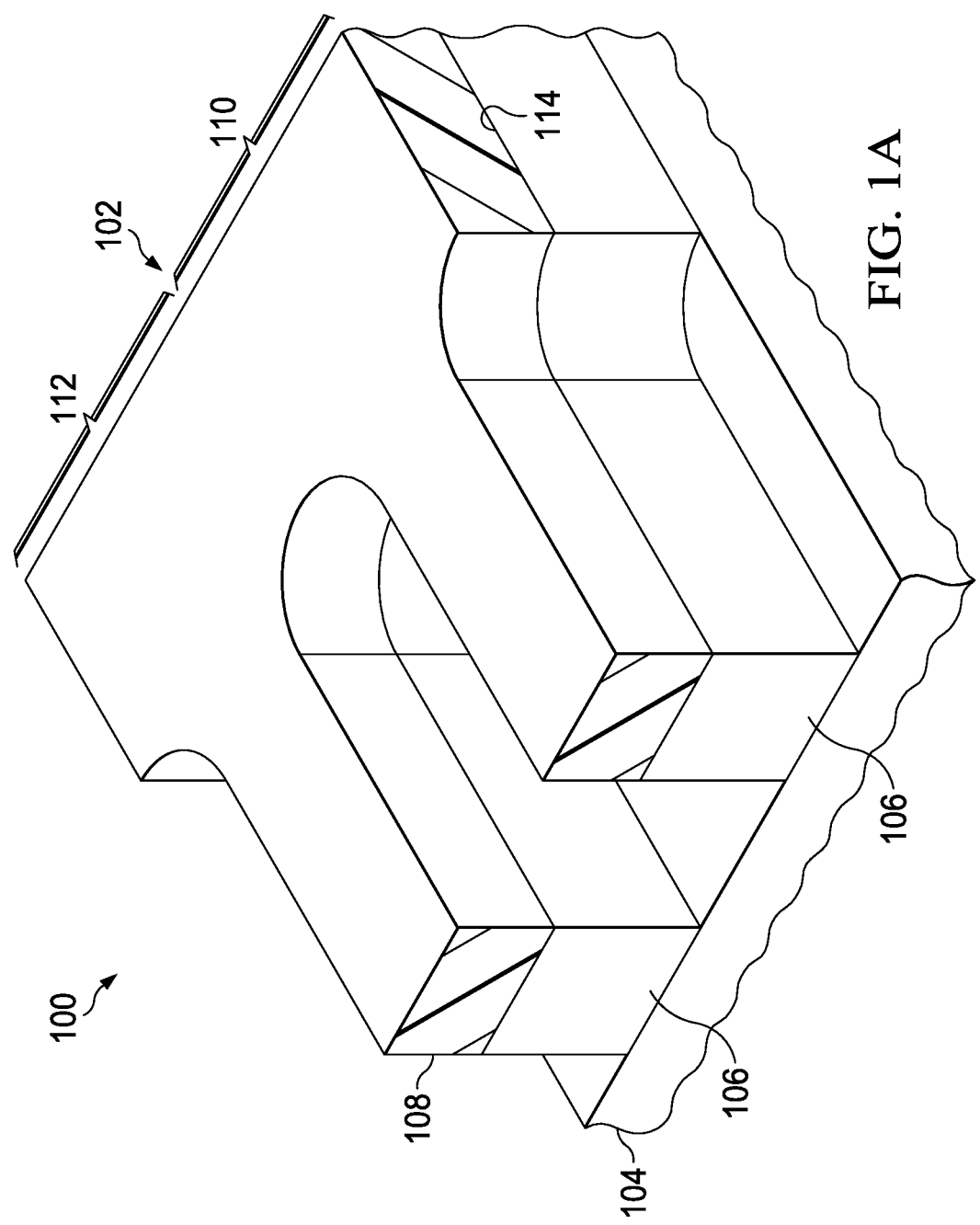
FIG. 1A through FIG. 1G are perspective and cross section views of a semiconductor device including an extended drain finFET, depicted in stages of an example method of formation.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A semiconductor device includes a finFET having a fin of a semiconductor material on a substrate of the semiconductor device. The finFET includes a drain contact region with a first conductivity type in the fin, and a body with a second conductivity type, opposite from the first conductivity type, in the fin. The finFET further includes a drain drift region, having the first conductivity type, in the fin, between the drain contact region and the body. The drain drift region includes an enhanced portion of the drain drift region having the first conductivity type between the drain contact region and the body. The enhanced portion of the drain drift region has a higher net average first conductivity type dopant concentration than the remainder of the drain drift region, the net average first conductivity type dopant concentrations being an average first conductivity type dopant concentrations minus an average second conductivity type dopant concentrations in the enhanced portion of the drain drift region. The terms "first conductivity type dopants" and "second conductivity type dopants" are understood to mean dopants which provide a first conductivity type and dopants which provide a second conductivity type, respectively, in a semiconductor material. For example, for a case in which the first conductivity type is n-type and the second conductivity type is p-type, phosphorus, arsenic, and antimony are first conductivity type dopants, as they provide n-type conductivity in the semiconductor material, and boron, gallium, and indium are second conductivity type dopants, as they provides p-type conductivity in the semiconductor material. The finFET also includes a first charge balance region and a second charge balance region. The first charge balance region is laterally adjacent to, and abutting, the enhanced portion of the drain drift region between the body and the drain contact region. The second charge balance region is laterally adjacent to, and abutting, the enhanced portion of the drain drift region between the body and the drain contact region, opposite from the first charge balance region. The terms "lateral" and "laterally" refer to directions parallel to a top surface of the fin, in examples disclosed herein. The first charge balance region and the second charge balance region each have the second conductivity type. The body has a body width which is a maximum lateral dimension of the fin through the body in a direction perpendicular to current flow during operation of the finFET. The drift region has a drain width which is a maximum lateral dimension of the fin through the drain drift region in a direction perpendicular to current flow during operation of the finFET. The drain width is greater than the body width. The finFET may include one or more fins configured in parallel, each having a drain contact region, a body, and a drain drift region with an enhanced portion of the drain drift region and first and second charge balance regions. The enhanced portion of the drain drift region may advantageously concentrate the current flow during operation of the finFET between the first charge balance region and the second charge balance region, providing a lower resistance for the finFET. The first charge balance region and the second charge balance region may advantageously enable a higher operating potential applied to the drain contact region compared to a similar finFET that does not have the charge balance regions.

It is noted that terms such as top, over, above, under, and below may be used in this disclosure. These terms should not be construed as limiting the position or orientation of a structure or element, but should be used to provide spatial relationship between structures or elements.

FIG. 1A through FIG. 1G are perspective and cross section views of a semiconductor device 100 including an extended drain finFET 102, hereinafter the finFET 102, depicted in stages of an example method of formation. Referring to FIG. 1A, the semiconductor device 100 may be implemented as a discrete semiconductor device, an integrated circuit, a microelectronic sensor, a microelectrical mechanical system (MEMS) device, an electro-optic device, or a micro optical mechanical system (MOMS) device, by way of example. The semiconductor device 100 is formed on a substrate 104. The substrate 104 may be implemented as a semiconductor wafer, such as a silicon wafer, or a silicon-on-insulator (SOI) wafer, for example. Alternatively, the substrate 104 may be implemented as a dielectric substrate, such as a sapphire wafer. The substrate 104 may have areas for additional semiconductor devices, not shown, similar to the semiconductor device 100. In this example, a semiconductor material 106 is disposed on the substrate 104. The semiconductor material 106 may include primarily monocrystalline silicon, with dopants, or may include another semiconductor material such as silicon with germanium, or silicon with carbon, for example. In versions of this example in which the substrate 104 is implemented as a semiconductor wafer, the semiconductor material 106 may be continuous with the substrate 104.

A fin mask 108 is formed over the semiconductor material 106 to cover an area for a first fin 110 of the finFET 102 and a second fin 112 of the finFET 102. The fin mask 108 may include photoresist and anti-reflection material, formed by a photolithographic process. The fin mask 108 may also include hard mask material, such as silicon dioxide, patterned by a reactive ion etch (RIE) process.

The semiconductor material 106 is removed where exposed by the fin mask 108, leaving the semiconductor material 106 under the fin mask 108 to form the first fin 110 and the second fin 112. The semiconductor material 106 may be removed from the substrate 104 by an RIE process using halogen radicals, such as fluorine radicals. The first fin 110 and the second fin 112 have a top surface 114; the semiconductor material 106 extends to the top surface 114.

The fin mask 108 is removed after forming the first fin 110 and the second fin 112. Photoresist in the fin mask 108 may be removed by a plasma process using oxygen radicals, such as an asher process, followed by a wet clean process using an aqueous solution of ammonium hydroxide and hydrogen peroxide. Alternatively, photoresist in the fin mask 108 may be removed by a wet etch process using an aqueous mixture of sulfuric acid and hydrogen peroxide, followed by the wet clean process of the aqueous solution of ammonium hydroxide and hydrogen peroxide. Hard mask material in the fin mask 108 may be removed by an RIE process, or by a buffered aqueous solution of dilute hydrofluoric acid.

Figure 1B:
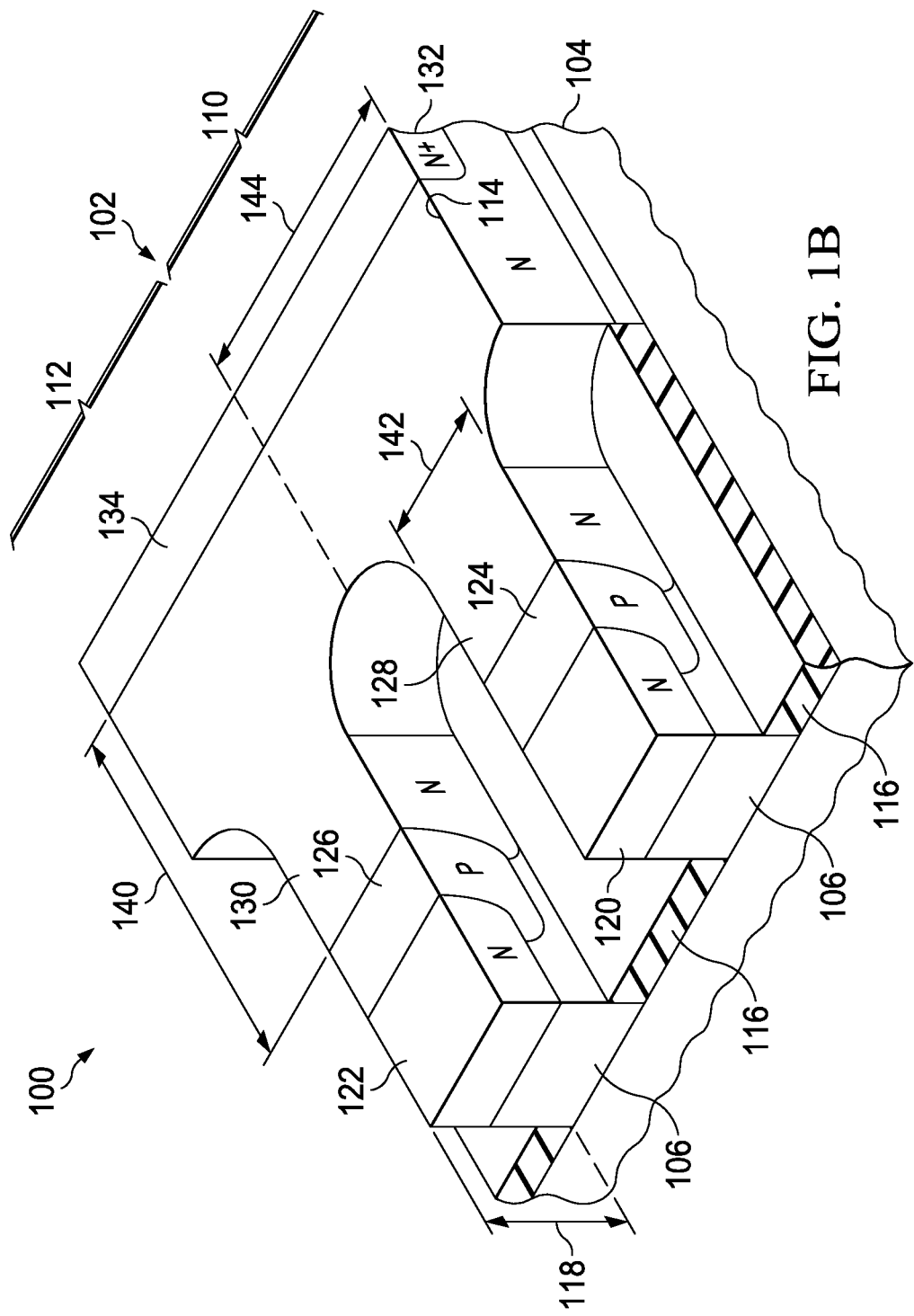

Referring to FIG. 1B, recess oxide 116 may be formed on the substrate 104 around the first fin 110 and the second fin 112. The recess oxide 116 includes a dielectric material such as silicon dioxide. The recess oxide 116 may be formed by forming the dielectric material over the substrate, and removing the dielectric material from over the first fin 110 and the second fin 112, and then recessing the dielectric material below the top surface 114, exposing the first fin 110 and the second fin 112. The first fin 110 extends above the substrate 104 to a fin height 118, which may be 300 nanometers to 800 nanometers, by way of example.

First conductivity type dopants, n-type dopants such as phosphorus in this example, are introduced into the first fin 110 to form a first source 120 and into the second fin 112 to form a second source 122. Second conductivity type dopants, p-type dopants such as boron in this example, are introduced into the first fin 110 to form a first body 124 and into the second fin 112 to form a second body 126 in the second fin 112. First conductivity type dopants, such as phosphorus in this example, are introduced into the first fin 110 to form a first drain drift region 128 and into the second fin 112 to form a second drain drift region 130. The first drain drift region 128 and the second drain drift region 130 may have average concentrations of the first conductivity type dopants from $1 \times 10^{16}$ cm$^{-3}$ to $4 \times 10^{16}$ cm$^{-3}$, by way of example, to enable operation of the finFET 102 at a desired drain potential. First conductivity type dopants, such as phosphorus and arsenic in this example, are introduced into the first fin 110 to form a first drain contact region 132 and into the second fin 112 to form a second drain contact region 134. The first drain contact region 132 and the second drain contact region 134 may have average concentrations of the first conductivity type dopants above $1 \times 10^{19}$ cm$^{-3}$, to provide low resistance connections to the first drain drift region 128 and the second drain drift region 130, and to subsequently-formed enhanced portions 136 and 138 of the drain drift regions 128 and 130, shown in FIG. 1E. In this example, the first drain contact region 132 and the second drain contact region 134 may be continuous, as depicted in FIG. 1B, which may advantageously provide lower resistance connections to the first drain drift region 128 and the second drain drift region 130, and to the subsequently-formed enhanced portions 136 and 138 of the drain drift regions 128 and 130, compared to a similar finFET with segmented drain contact regions.

A drain length 140, which is a lateral dimension between the first body 124 and the first drain contact region 132 along the top surface 114 of the first fin 110 in a direction parallel to current flow during operation of the finFET 102, may be selected to enable operation of the finFET 102 at the desired drain potential. The drain length 140 may be 200 nanometers to 1 micron, by way of example. For a specific example, having a value of 800 nanometers for the drain length 140 may enable operation of the finFET 102 at a drain potential of 20 volts.

The first body 124 has a body width 142 which is a maximum lateral dimension of the first body 124 in a direction perpendicular to current flow during operation of the finFET 102. The direction of the body width 142 is perpendicular to the direction of the drain length 140. Furthermore, the first drain drift region 128 has a drain width 144 which is a maximum lateral dimension of the first drain drift region 128 in the direction perpendicular to current flow during operation of the finFET 102. The direction of the drain width 144 is perpendicular to the direction of the drain length 140. The drain width 144 is larger than the body width 142. The body width 142 may be 100 nanometers to 300 nanometers, by way of example. The drain width 144 may be 300 nanometers to 600 nanometers, by way of example. By way of example, the drain width 144 may be larger than the body width 142 by 200 nanometers to 300 nanometers.

Figure 1C:
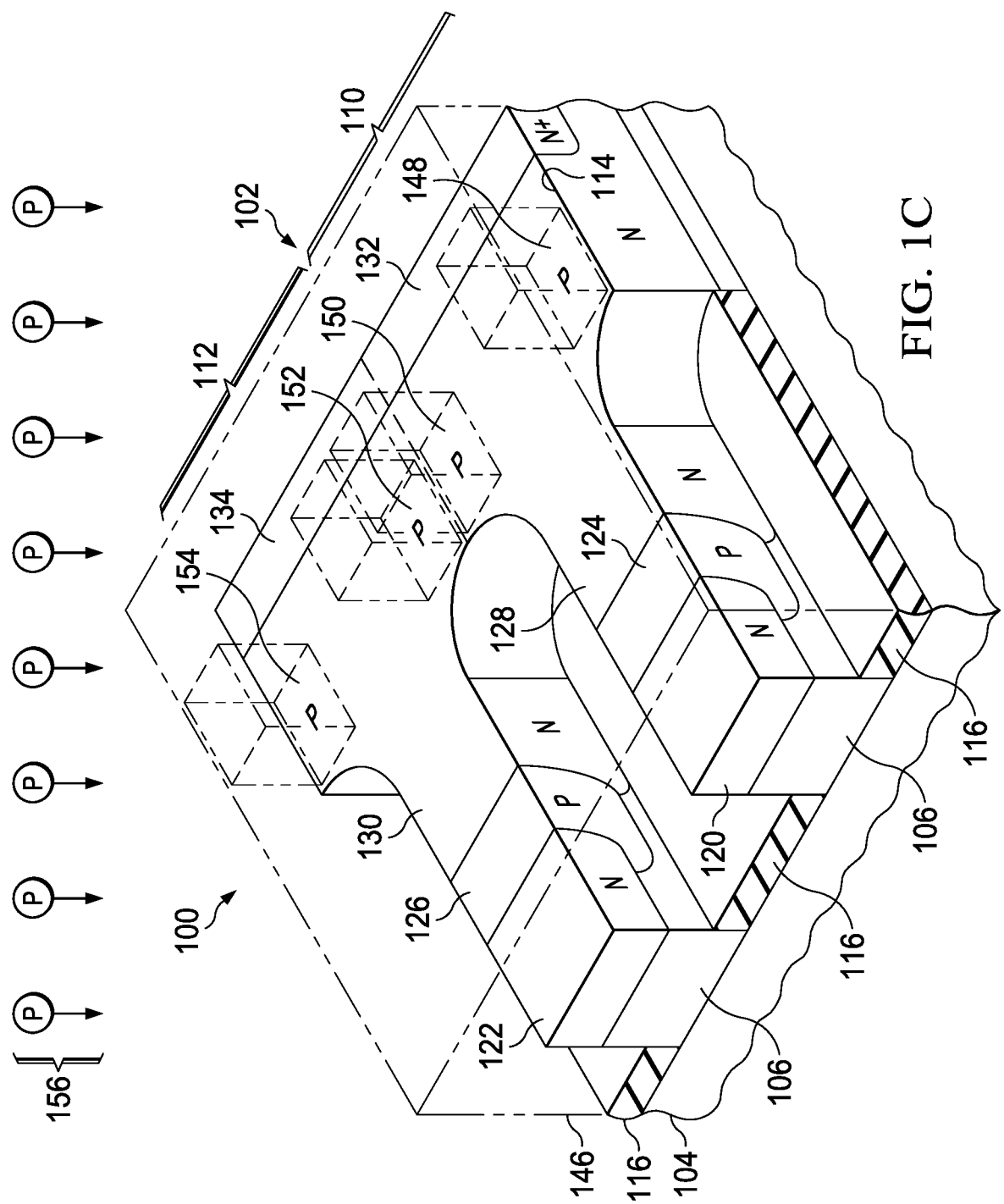

Referring to FIG. 1C, a charge balance mask 146 is formed over the semiconductor device 100. The charge balance mask 146 exposes the first fin 110 in an area for a first charge balance region 148 and in an area for a second charge balance region 150, and exposes the second fin 112 in an area for a third charge balance region 152 and in an area for a fourth charge balance region 154. The area for the first charge balance region 148 and the area for the second charge balance region 150 are on opposite sides of the first drain drift region 128. Similarly, the area for the third charge balance region 152 and the area for the fourth charge balance region 154 are on opposite sides of the second drain drift region 130. The charge balance mask 146 may include photoresist and anti-reflection material, such as a bottom anti-reflection coat (BARC), and may be formed by a photolithographic process.

Second conductivity type dopants 156, for example boron in this example, are implanted into the first fin 110 and the second fin 112 where exposed by the charge balance mask 146, namely, the areas for the charge balance regions 148, 150, 152, and 154. The second conductivity type dopants 156 may be implanted at a total dose of $5 \times 10^{11}$ cm$^{-2}$ to $1 \times 10^{13}$ cm$^{-2}$. The second conductivity type dopants 156 may be implanted at more than one implant energy to distribute the second conductivity type dopants 156 vertically in the first fin 110 and the second fin 112.

The charge balance mask 146 is removed after the second conductivity type dopants 156 are implanted. Photoresist and anti-reflection material in the charge balance mask 146 may be removed by a plasma process using oxygen radicals, such as an asher process.

Figure 1D:
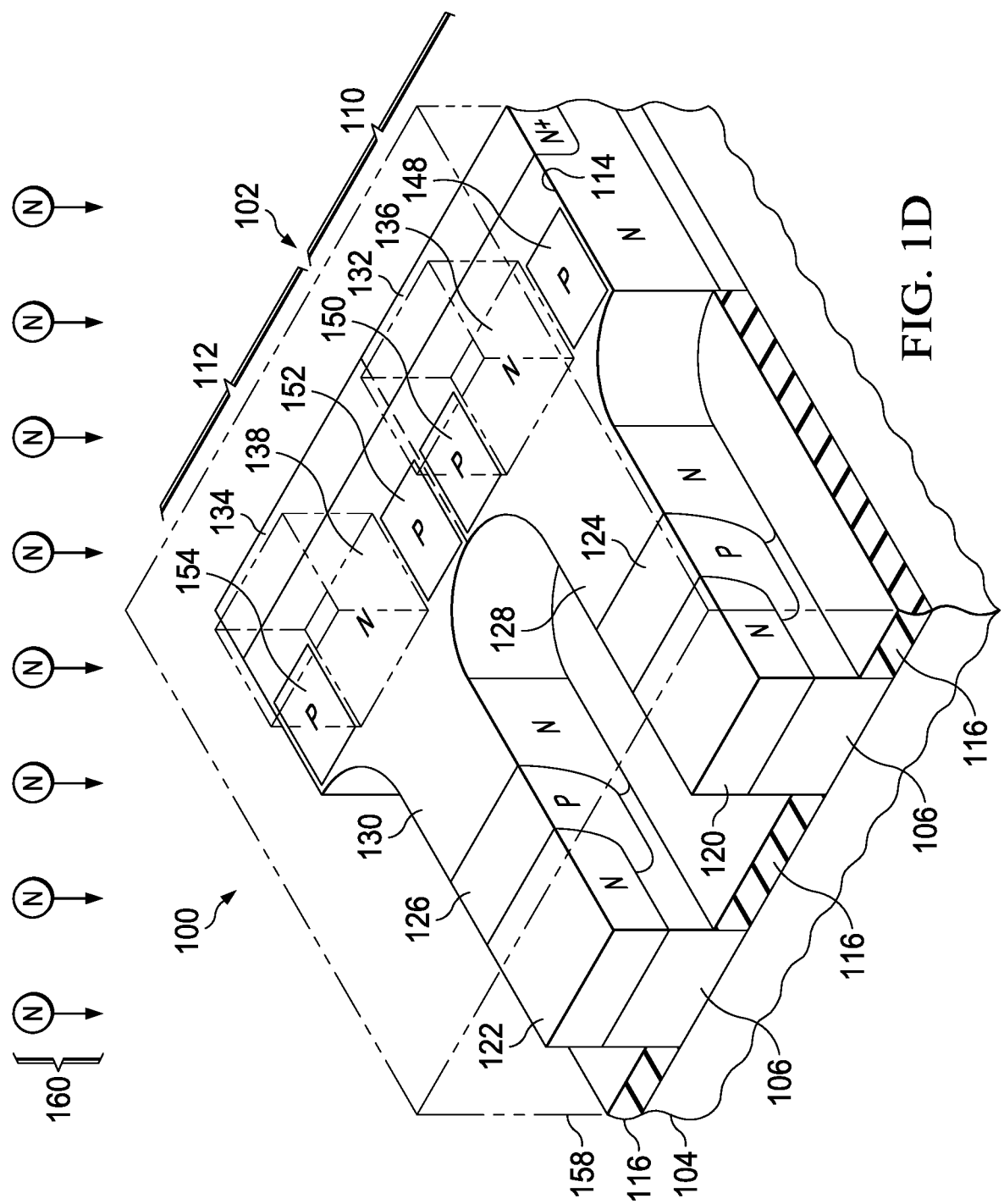

Referring to FIG. 1D, a drift region mask 158 is formed over the semiconductor device 100. The drift region mask 158 exposes the first fin 110 in an area for a first enhanced portion 136 in the first drain drift region 128 of FIG. 1B, and exposes the second fin 112 in an area for a second enhanced portion 138 in the second drain drift region 130 of FIG. 1B. The area for the first enhanced portion 136 of the first drain drift region 128 is between the area for the first charge balance region 148 and the area for the second charge balance region 150. Similarly, the area for the second enhanced portion 138 of the second drain drift region 130 is between the area for the third charge balance region 152 and the area for the fourth charge balance region 154. The drift region mask 158 may have a composition similar to that of the charge balance mask 146 of FIG. 1C, and may be formed by a similar process.

First conductivity type dopants 160, for example phosphorus in this example, are implanted into the first fin 110 and the second fin 112 where exposed by the drift region mask 158, namely, the areas for the enhanced portions 136 and 138 of the drain drift regions 128 and 130. The first conductivity type dopants 160 may be implanted at a total dose that is 65 percent to 150 percent of the total dose of the second conductivity type dopants 156 disclosed in reference to FIG. 1C, to attain a desired charge balance during operation of the finFET 102. The first conductivity type dopants 160 may be implanted at more than one implant energy to distribute the first conductivity type dopants 160 vertically in the first fin 110 and the second fin 112.

The drift region mask 158 is removed after the first conductivity type dopants 160 are implanted. The drift region mask 158 may be removed by a process similar to that used to remove the charge balance mask 146.

In an alternate version of this example, the implanted areas for the first enhanced portion 136 and the second enhanced portion 138 of the first drain drift region 128 and the second drain drift region 130 may extend to the first body 124 and the second body 126 of FIG. 1B, respectively. In another alternate version, the implanted areas for the first enhanced portion 136 and the second enhanced portion 138 of the first drain drift region 128 and the second drain drift region 130 may extend to the first drain contact region 132 and the second drain contact region 134 of FIG. 1B, respectively. In a further alternate version, the first conductivity type dopants 160 may be implanted after the second conductivity type dopants 156 of FIG. 1C.

Figure 1E:
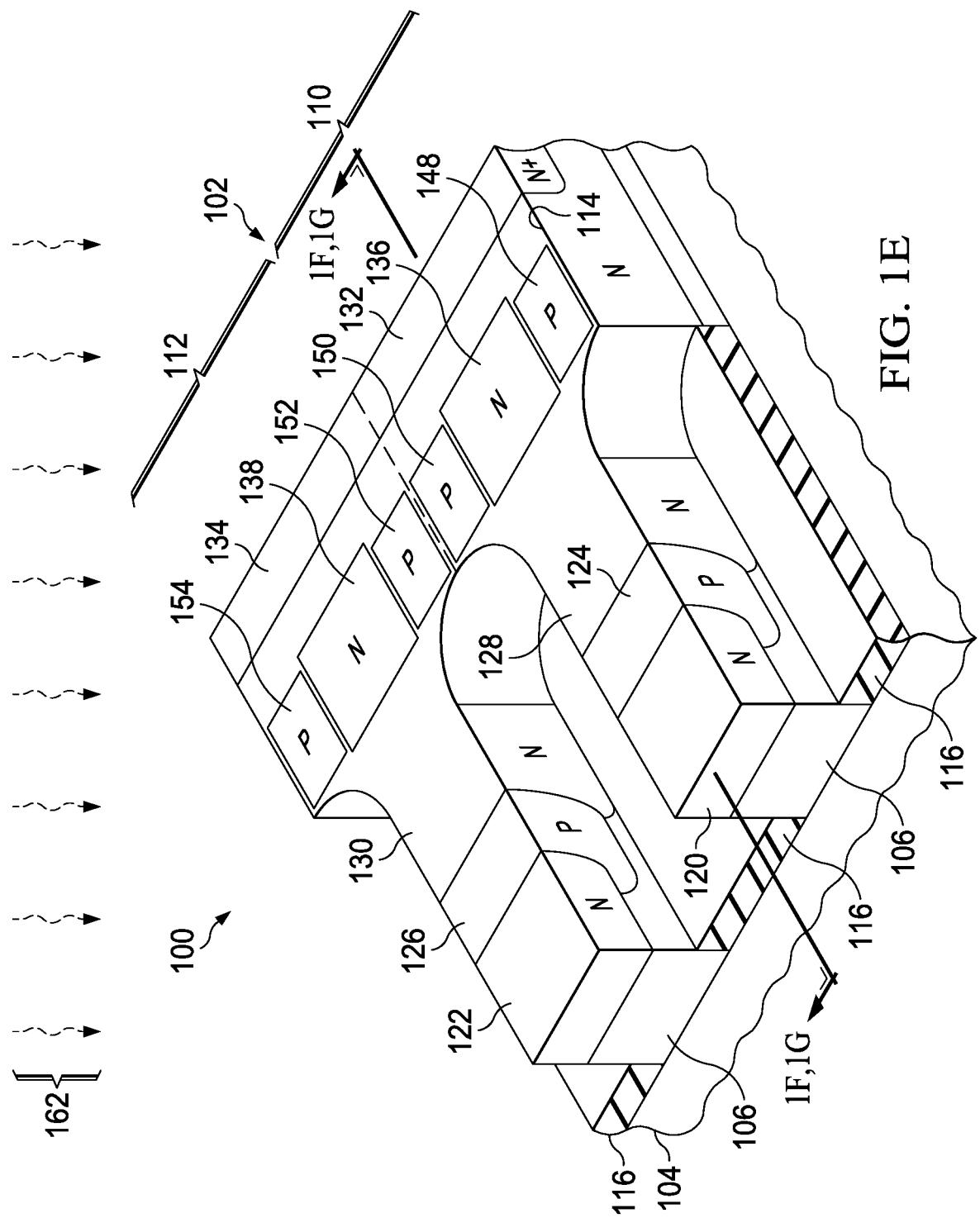

Referring to FIG. 1E, the substrate 104 is heated by an anneal process 162 which activates the first conductivity type dopants 160 of FIG. 1D to form the first enhanced portion 136 in the first drain drift region 128 and form the second enhanced portion 138 of the second drain drift region 130 in the second drain drift region 130. The anneal process 162 also activates the second conductivity type dopants 156 of FIG. 1C to form the first charge balance region 148 and the second charge balance region 150 in the first fin 110, and form the third charge balance region 152 and the fourth charge balance region 154 in the second fin 112. The enhanced portions 136 and 138 of the drain drift regions 128 and 130 may have net average first conductivity type dopant concentrations of $1 \times 10^{16}$ cm$^{-3}$ to $4 \times 10^{16}$ cm$^{-3}$ The charge balance regions 148, 150, 152, and 154 may have net average second conductivity type dopant concentrations of 65 percent to 150 percent of the net average first conductivity type dopant concentrations in the enhanced portions 136 and 138 of the drain drift regions 128 and 130, the net average first conductivity type dopant concentrations being average second conductivity type dopant concentrations minus average first conductivity type dopant concentrations in the charge balance regions 148, 150, 152, and 154. The anneal process 162 may be implemented as a rapid thermal anneal, a spike anneal, or a flash anneal, by way of example. A rapid thermal anneal may heat the substrate 104 to 1000 C to 1150° C. for 5 seconds to 60 seconds, and may be implemented in a rapid thermal processor using an incandescent lamp. A spike anneal may heat the substrate 104 to 1100 C to 1250° C. for 100 milliseconds seconds to 5 seconds, and may be implemented an arc flash lamp. A flash anneal may heat the substrate 104 to 1200° C. to 1350° C. for 50 microseconds to 1 millisecond, and may be implemented by a flash lamp or scanned laser.

Forming the enhanced portions 136 and 138 of the drain drift regions 128 and 130 by implanting the first conductivity type dopants 160 without overlapping implants of the second conductivity type dopants 156, as disclosed in this example, may provide consistent average dopant concentrations in the enhanced portions 136 and 138 of the drain drift regions 128 and 130, advantageously providing consistent performance of the finFET 102. Similarly, forming the charge balance regions 148, 150, 152, and 154 by implanting the second conductivity type dopants 156 without overlapping implants of the first conductivity type dopants 160, as disclosed in this example, may provide consistent average dopant concentrations in the charge balance regions 148, 150, 152, and 154, advantageously providing even more consistent performance of the finFET 102.

The first charge balance region 148 is adjacent to the first enhanced portion 136 of the first drain drift region 128 between the first body 124 and the first drain contact region 132, and the second charge balance region 150 is adjacent to the first enhanced portion 136 of the first drain drift region 128 between the first body 124 and the first drain contact region 132, on an opposite side of the first enhanced portion 136 of the first drain drift region 128 from the first charge balance region 148. Similarly, the third charge balance region 152 is adjacent to the second enhanced portion 138 of the second drain drift region 130 between the second body 126 and the second drain contact region 134, and the fourth charge balance region 154 is adjacent to the second enhanced portion 138 of the second drain drift region 130 between the second body 126 and the second drain contact region 134, on an opposite side of the second enhanced portion 138 of the second drain drift region 130 from the third charge balance region 152. In this example, the second charge balance region 150 may be continuous with the third charge balance region 152.

Having the first charge balance region 148 and the second charge balance region 150 adjacent to, and on opposite sides of, the first enhanced portion 136 of the first drain drift region 128, and similarly for the third charge balance region 152 and the fourth charge balance region 154 with respect to the second enhanced portion 138 of the second drain drift region 130, may advantageously enable a higher operating potential applied to the first drain contact region 132 compared to a similar finFET that does not have the charge balance regions.

Figure 1F:
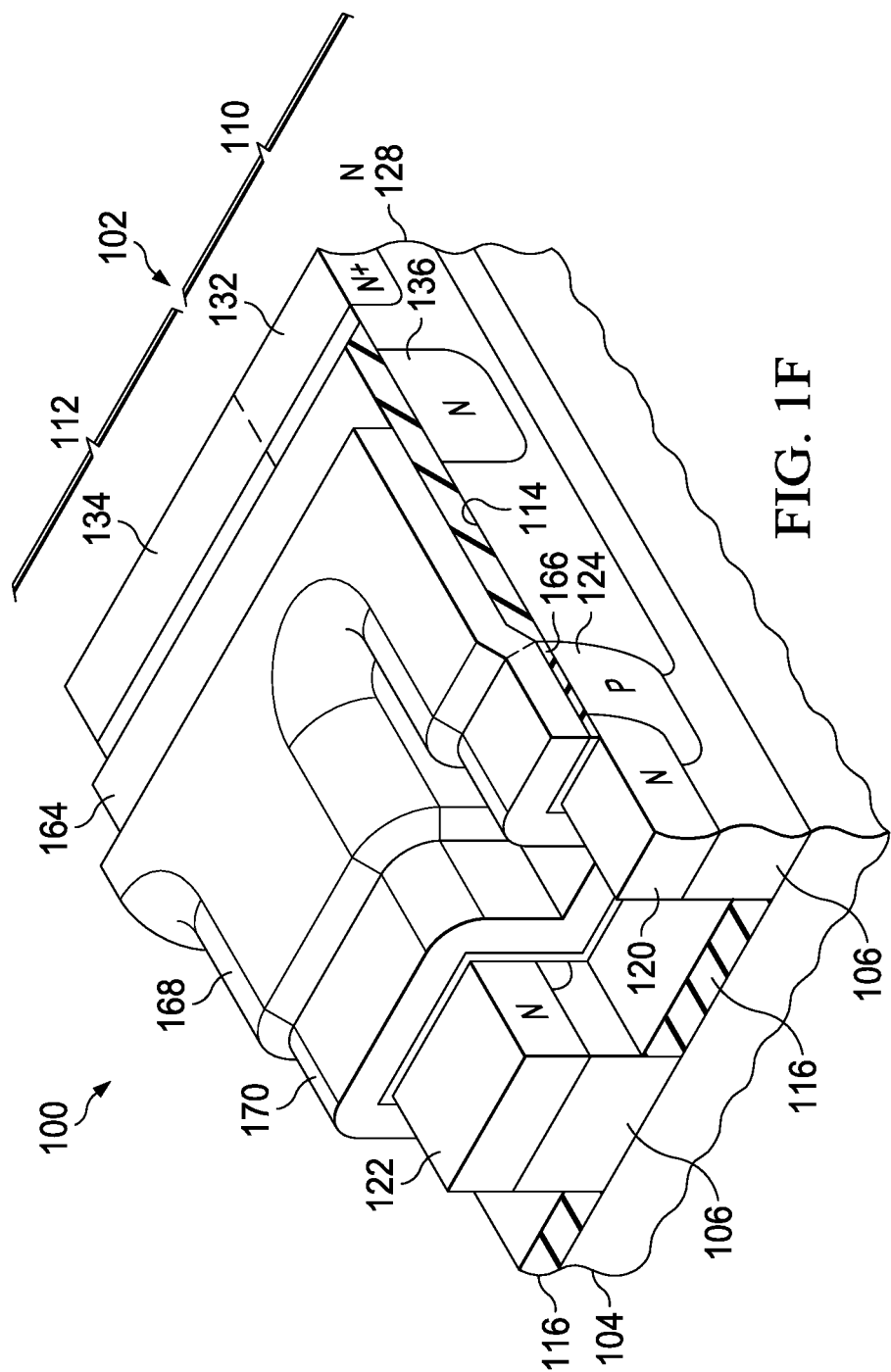
Figure 1G:
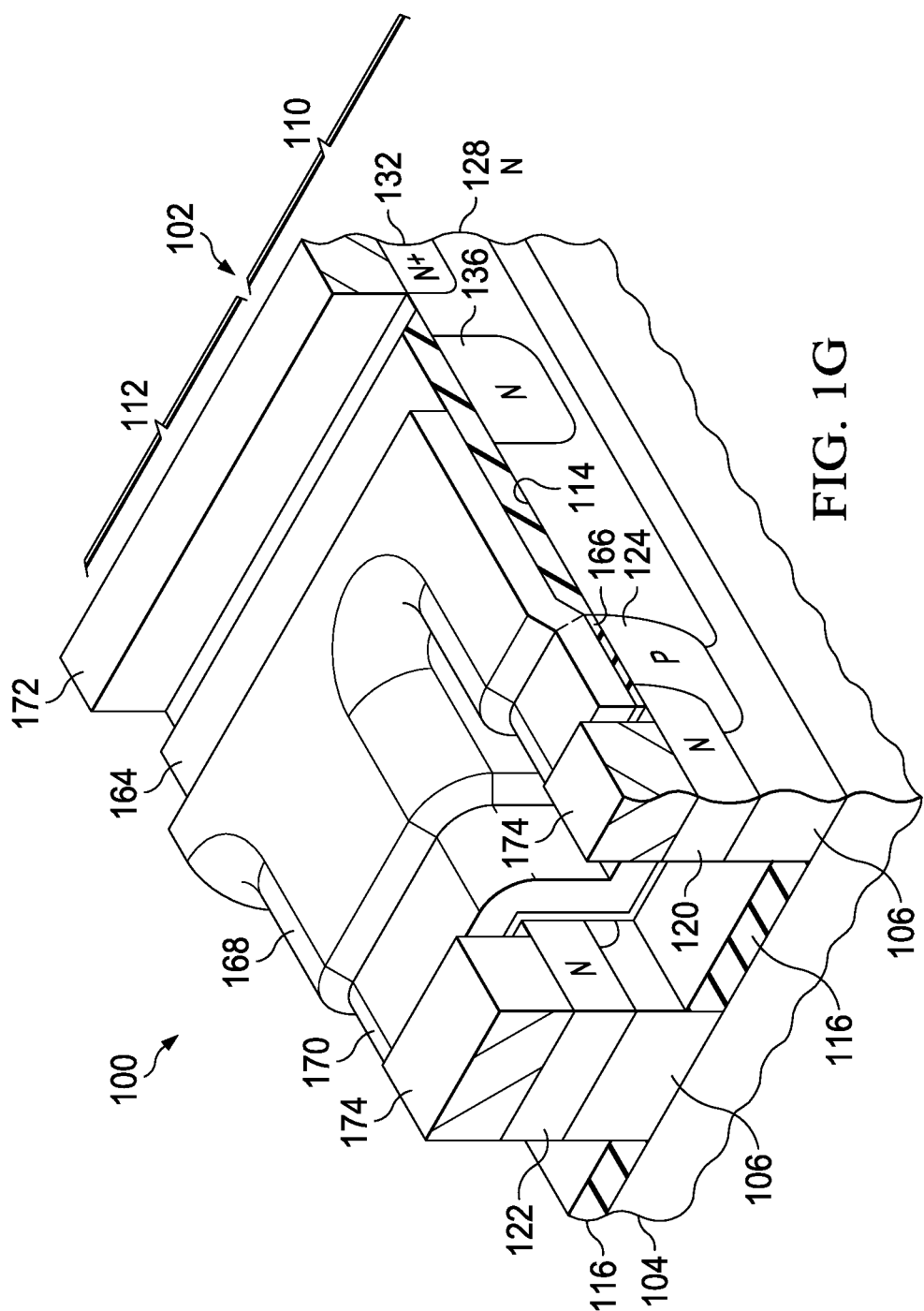

FIG. 1F and FIG. 1G are cut-away views of the semiconductor device 100 along the cut line shown in FIG. 1E, depicting further stages of formation. Referring to FIG. 1F, a field plate dielectric layer 164 is formed over the substrate 104, extending from proximate to the first body 124, and extending from proximate to the second body 126 of FIG. 1E, obscured in FIG. 1F, toward the first drain contact region 132 and the second drain contact region 134, at least partially overlapping the first enhanced portion 136 of the first drain drift region 128, and at least partially overlapping the second enhanced portion 138 of the second drain drift region 130 of FIG. 1E, obscured in FIG. 1F. The field plate dielectric layer 164 may also at least partially overlap the first charge balance region 148 of FIG. 1E, cut away in FIG. 1F, and the second charge balance region 150, the third charge balance region 152, and the fourth charge balance region 154, of FIG. 1E, obscured in FIG. 1F. The field plate dielectric layer 164 may include silicon dioxide or silicon dioxide-based dielectric material, and may be formed by a chemical vapor deposition (CVD) process or a plasma enhanced chemical vapor deposition (PECVD) process, by way of example. A thickness of the field plate dielectric layer 164 may depend on the desired drain potential of the finFET 102. By way of example, the thickness of the field plate dielectric layer 164 may be 30 nanometers for a 5 volt desired drain potential, and may be 120 nanometers for a 20 volt desired drain potential. The field plate dielectric layer 164 may be patterned by a wet etch process to provide a tapered profile proximate to the first body 124 and the second body 126.

A gate dielectric layer 166 is formed on the first body 124, and on the second body 126 of FIG. 1E, obscured in FIG. 1F, on the top surface 114 of the first fin 110 and the second fin 112, and extending on to lateral surfaces of the first body 124 and the second body 126, the lateral surfaces extending from the top surface 114 to the recess oxide 116. The gate dielectric layer 166 may include silicon dioxide, nitridated silicon dioxide, hafnium oxide, zirconium oxide, tantalum oxide, or other dielectric material suitable for a gate dielectric of a finFET. The gate dielectric layer 166 may be formed by a thermal oxidation process, a CVD process, a nitridation process, or any combination thereof. The gate dielectric layer 166 may have a thickness of 2 nanometers to 12 nanometers, by way of example.

A field plate 168 is formed over the field plate dielectric layer 164 and a gate 170 is formed over the gate dielectric layer 166. In this example, the field plate 168 may be continuous with the gate 170. The gate 170 extends over the top surface 114 of the first fin 110 and the second fin 112, overlapping the first body 124 and the second body 126, and over the lateral surfaces of the first body 124 and the second body 126. The field plate 168 and the gate 170 may include polycrystalline silicon, commonly referred to as polysilicon, and may include a layer of metal silicide on the polysilicon. Alternatively, the field plate 168 and the gate 170 may include metal gate materials, such as titanium, titanium nitride, tantalum, or tantalum nitride. The field plate 168 and the gate 170 may be formed by forming a conductive layer of polysilicon or gate metals over the field plate dielectric layer 164 and the gate dielectric layer 166, forming a combination field plate/gate mask over the conductive layer, and removing the conductive layer where exposed by the combination field plate/gate mask.

The field plate 168 may advantageously reduce an electric field in the first enhanced portion 136 of the first drain drift region 128 and the second enhanced portion 138 of the second drain drift region 130 during operation of the finFET 102. Forming the field plate 168 and the gate 170 concurrently, as disclosed in this example, may advantageously reduce fabrication complexity and cost of the semiconductor device 100.

Referring to FIG. 1G, a drain terminal 172 is formed on the first drain contact region 132, and on the second drain contact region 134 of FIG. 1F, obscured in FIG. 1G. In this example, the drain terminal 172 is continuous. Source terminals 174 are formed on the first source 120 the second source 122. The drain terminal 172 and the source terminals 174 are electrically conductive, and may be formed concurrently. A pre-metal dielectric (PMD) layer, not shown, may be formed over the finFET 102 prior to forming the drain terminal 172 and the source terminals 174. The drain terminal 172 and the source terminals 174 may be formed by forming contact holes through the PMD layer, and forming one or more layers of conductive material, such as titanium, titanium nitride, and tungsten, on the PMD layer, extending into the contact holes and making electrical connections to the first drain contact region 132, the second drain contact region 134, the first source 120 the second source 122. The layers of conductive material are subsequently removed from over the PMD layer, leaving the layers of conductive material in the contact holes to provide the drain terminal 172 and the source terminals 174. The drain terminal 172 and the source terminals 174 provide nodes for electrically connecting the finFET 102 to other components, such as active components or input/output terminals, in the semiconductor device 100.

Figure 2A:
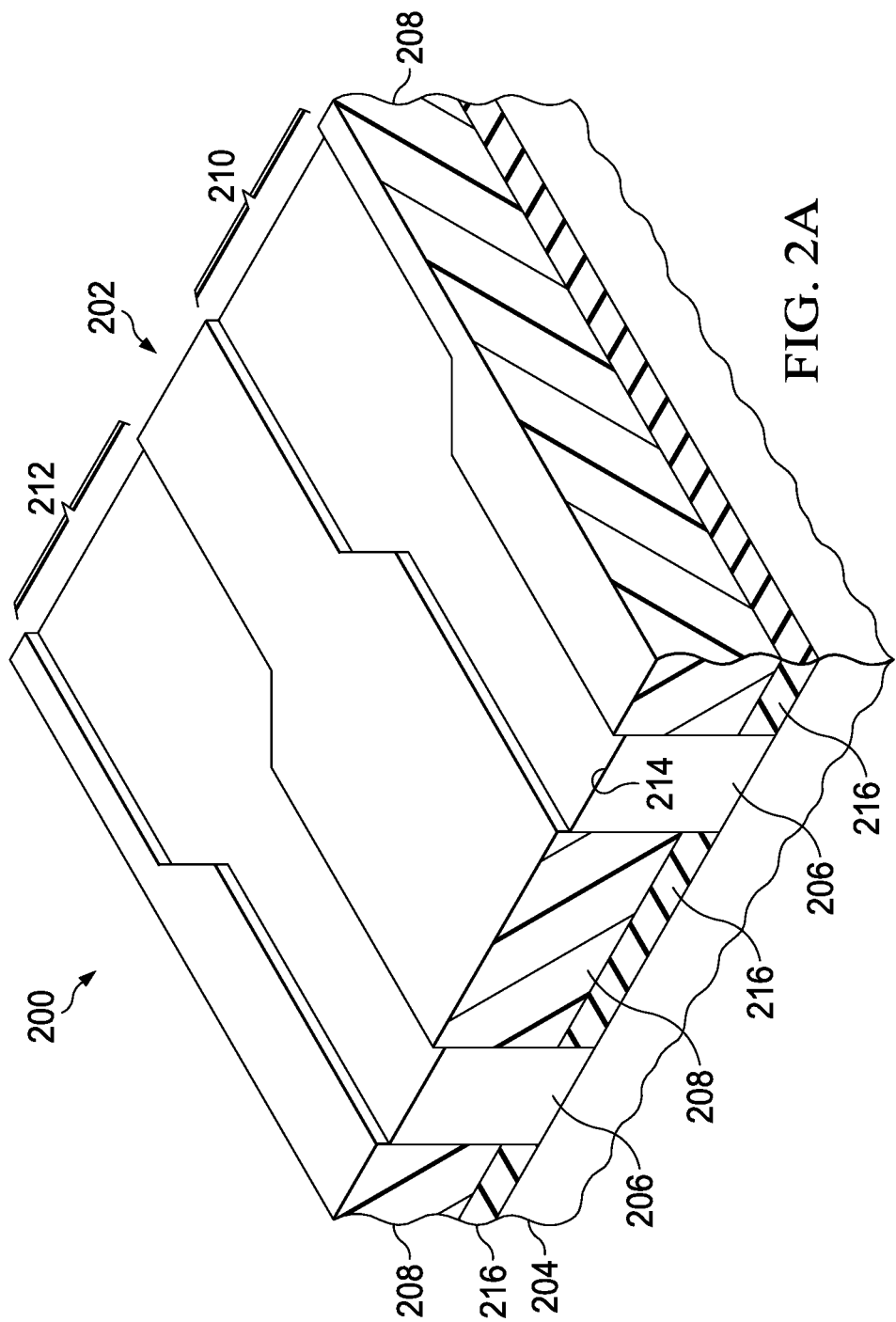
FIG. 2A through FIG. 2G are perspective and cross section views of a semiconductor device including an extended drain finFET, depicted in stages of another example method of formation.

FIG. 2A through FIG. 2G are perspective and cross section views of a semiconductor device 200 including an extended drain finFET 202, hereinafter the finFET 202, depicted in stages of another example method of formation. Referring to FIG. 2A, the semiconductor device 200 may be implemented as any of the examples disclosed in reference to the semiconductor device 100 of FIG. 1A. In this example, formation of the semiconductor device 200 starts with acquiring a substrate 204. The substrate 204 may be implemented as a silicon wafer or an SOI wafer, for example. The substrate 204 may have areas for additional semiconductor devices, not shown, similar to the semiconductor device 200.

Recess oxide 216 is formed over the substrate 204. The recess oxide 216 may include one or more layers of silicon dioxide or silicon dioxide with a few weight percent hydrogen content, and may be formed by thermal oxidation of silicon, or by a low pressure chemical vapor deposition (LPCVD) process. The recess oxide 216 may be formed by forming the one or more layers of silicon dioxide, and patterning the one or more layers concurrently a fin mask 208.

The fin mask 208 is formed over the recess oxide 216. The fin mask 208 may include one or more layers of epitaxial mask material, such as silicon dioxide, silicon nitride, or silicon-doped boron nitride ($Si_xBN$) with 1 atomic percent to 30 atomic percent silicon, or a combination thereof. The silicon-doped boron nitride may be formed using a PECVD process with diborane ($B_2H_6$), silane ($SiH_4$) and ammonia ($NH_3$), an atomic layer deposition (ALD) process with boron trichloride ($BCl_3$), dichlorosilane ($SiH_2Cl_2$) and ammonia, or a metal organic chemical vapor deposition (MOCVD) process. The fin mask 208 may be formed by forming the one or more layers of epitaxial mask material over the one or more layers of silicon dioxide for the recess oxide 216, forming a hard mask over the one or more layers of silicon nitride or silicon-doped boron nitride which exposes the areas for the first fin 210 and the second fin 212, followed by etching the one or more layers of silicon nitride or silicon-doped boron nitride for the fin mask 208 and the one or more layers of silicon dioxide for the recess oxide 216 using an RIE process using fluorine radicals, to concurrently form the fin mask 208 and the recess oxide 216. Including the silicon-doped boron nitride in the fin mask 208 may provide etch selectivity to underlying materials such as silicon and silicon dioxide. The fin mask 208 exposes areas for a first fin 210 and a second fin 212 of the finFET 202.

The first fin 210 and the second fin 212 are formed concurrently of a semiconductor material 206 by an epitaxial process on the substrate 204, where exposed by the fin mask 208 and the recess oxide 216. In this example, the semiconductor material 206 of the first fin 210 and the second fin 212 may have a different composition than the substrate 204. For example, the substrate 204 may include primarily monocrystalline silicon, with essentially no germanium or carbon. In versions of this example in which the finFET 202 is a p-channel finFET 202, the semiconductor material 206 of the first fin 210 and the second fin 212 may include silicon-germanium to provide a higher hole mobility compared to silicon. In versions of this example in which the finFET 202 is an n-channel finFET 202, the semiconductor material 206 of the first fin 210 and the second fin 212 may include silicon-carbon to provide a higher electron mobility compared to silicon. This example will describe the finFET 202 as a p-channel finFET 202. A corresponding n-channel finFET 202 may be formed by appropriate changes in conductivity types of dopants used to form the finFET 202.

The semiconductor material 206 extends to a top surface 214 of the first fin 210 and the second fin 212. The first fin 210, and the second fin 212 may have dimensions as disclosed in reference to the first fin 110, and the second fin 112 of FIG. 1B and FIG. 1B. In an alternate version of this example, the epitaxial process may be continued until the semiconductor material 206 extends above a top surface of the fin mask 208, and the semiconductor material 206 above the top surface of the fin mask 208 may be removed by an etchback process or a chemical mechanical polish (CMP) process.

After the first fin 210 and the second fin 212 are formed, the fin mask 208 is removed, leaving the recess oxide 216 in place. Silicon nitride and silicon-doped boron nitride in the fin mask 208 may be removed by a plasma etch process using fluorine radicals.

Figure 2B:
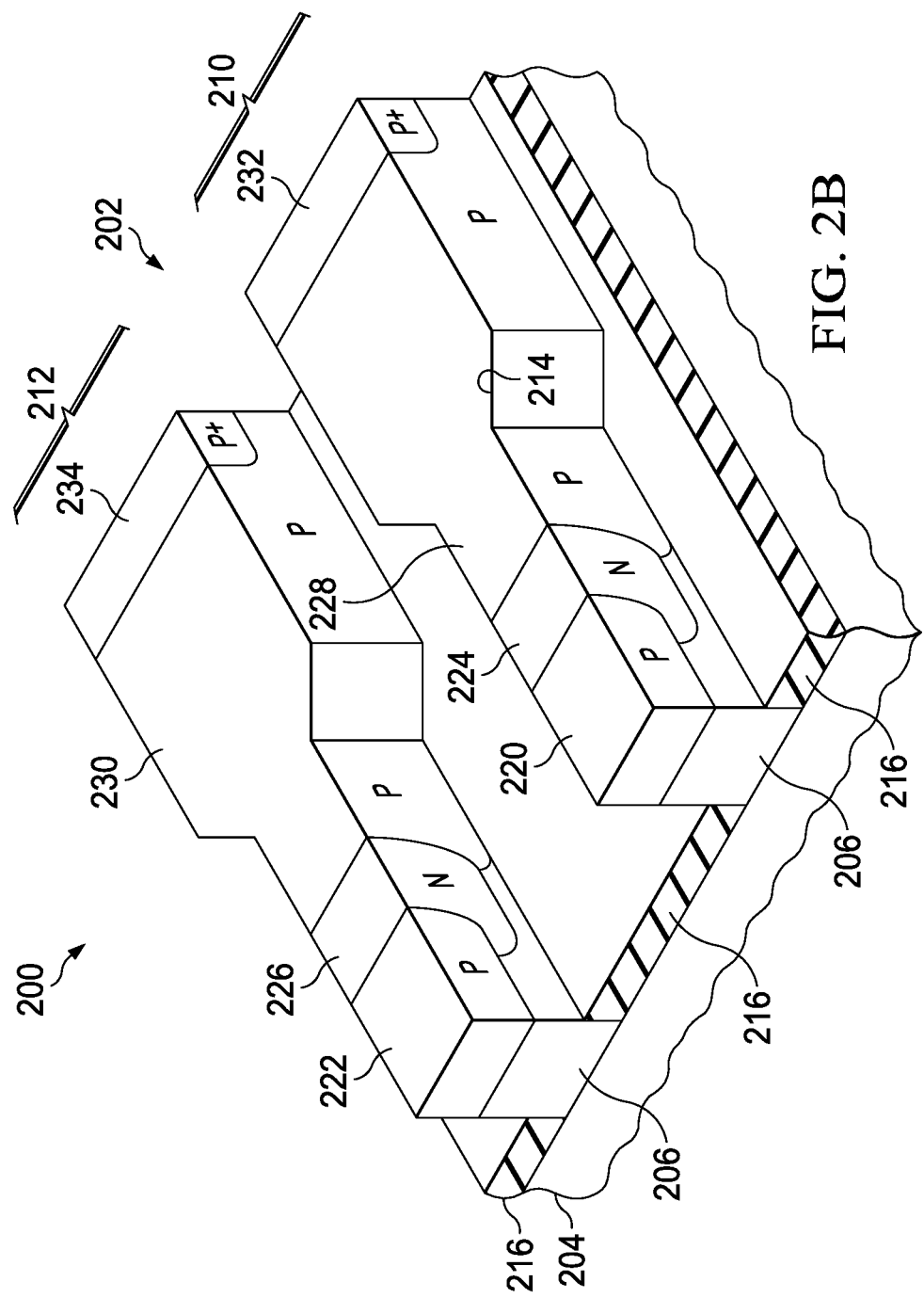

Referring to FIG. 2B, first conductivity type dopants, p-type dopants such as boron, and optionally gallium or indium, in this example, are introduced into the substrate 204 to form a first source 220 in the first fin 210 and form a second source 222 in the second fin 212. Second conductivity type dopants, p-type dopants such as phosphorus, and optionally arsenic or antimony, in this example, are introduced into the substrate 204 to form a first body 224 in the first fin 210 and form a second body 226 in the second fin 212. First conductivity type dopants, such as boron in this example, are introduced into the substrate 204 to form a first drain drift region 228 in the first fin 210 and form a second drain drift region 230 in the second fin 212. The first drain drift region 228 and the second drain drift region 230 may have average concentrations of the first conductivity type dopants from $1 \times 10^{16}$ cm$^{-3}$ to $4 \times 10^{16}$ cm$^3$, as disclosed in reference to FIG. 1B. First conductivity type dopants, such as boron, and optionally gallium or indium, in this example, are introduced into the first drain drift region 228 to form a first drain contact region 232 in the first fin 210 and into the second drain drift region 230 to form a second drain contact region 234 in the second fin 212. The first drain contact region 232 and the second drain contact region 234 may have average concentrations of the first conductivity type dopants above $1 \times 10^{19}$ cm$^{-3}$, as disclosed in reference to FIG. 1B. In this example, the first drain contact region 232 and the second drain contact region 234 are segmented, which may advantageously reduce current crowding in the finFET 202 during operation of the semiconductor device 200.

Figure 2C:
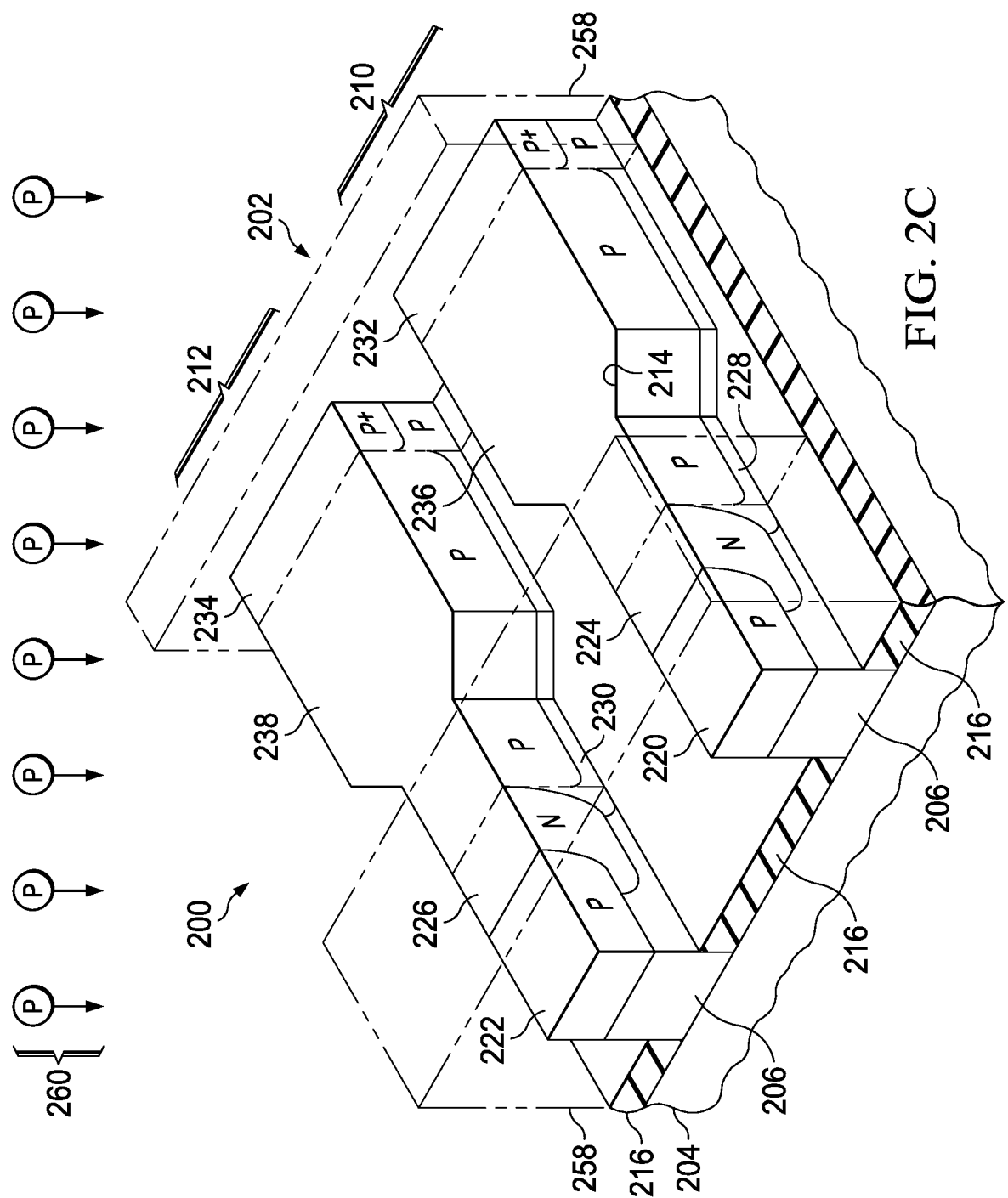

Referring to FIG. 2C, a drift region mask 258 is formed over the substrate 204. The drift region mask 258 exposes the substrate 204 in an area that extends across the first fin 210 for a first enhanced portion 236 of the first drain drift region 228, shown in FIG. 2E, in the first drain drift region 228 of FIG. 2B, and that extends across the second fin 212 for a second enhanced portion 238 of the second drain drift region 230, shown in FIG. 2E, in the second drain drift region 230 of FIG. 2B. The drift region mask 258 may have a composition similar to the drift region mask 158 of FIG. 1D, and may be formed by a process similar to that used to form the drift region mask 158. Forming the drift region mask 258 to expose the substrate 204 continuously across the first fin 210 and the second fin 212 may advantageously provide greater process latitude for the process used to form the drift region mask 258, compared to a mask with discrete exposed areas. The area exposed by the drift region mask 258 may extend from the first body 224 and the second body 226 of FIG. 2B to the first drain contact region 232 and the second drain contact region 234 of FIG. 2B, as depicted in FIG. 2C. Alternatively, the area exposed by the drift region mask 258 may be recessed from the first body 224 and the second body 226, or may be recessed from the first drain contact region 232 and the second drain contact region 234.

First conductivity type dopants 260, for example boron in this example, are implanted into the first fin 210 and the second fin 212 where exposed by the drift region mask 258. The first conductivity type dopants 260 may be implanted at a total dose of $5 \times 10^{11}$ cm$^{-2}$ to $3 \times 10^{12}$ cm$^{-2}$. The first conductivity type dopants 260 may be implanted at more than one implant energy to distribute the first conductivity type dopants 260 vertically in the first fin 210 and the second fin 212.

The drift region mask 258 is removed after the first conductivity type dopants 260 are implanted. The drift region mask 258 may be removed by a process as disclosed in reference to removal of the drift region mask 158 of FIG. 1D.

Figure 2D:
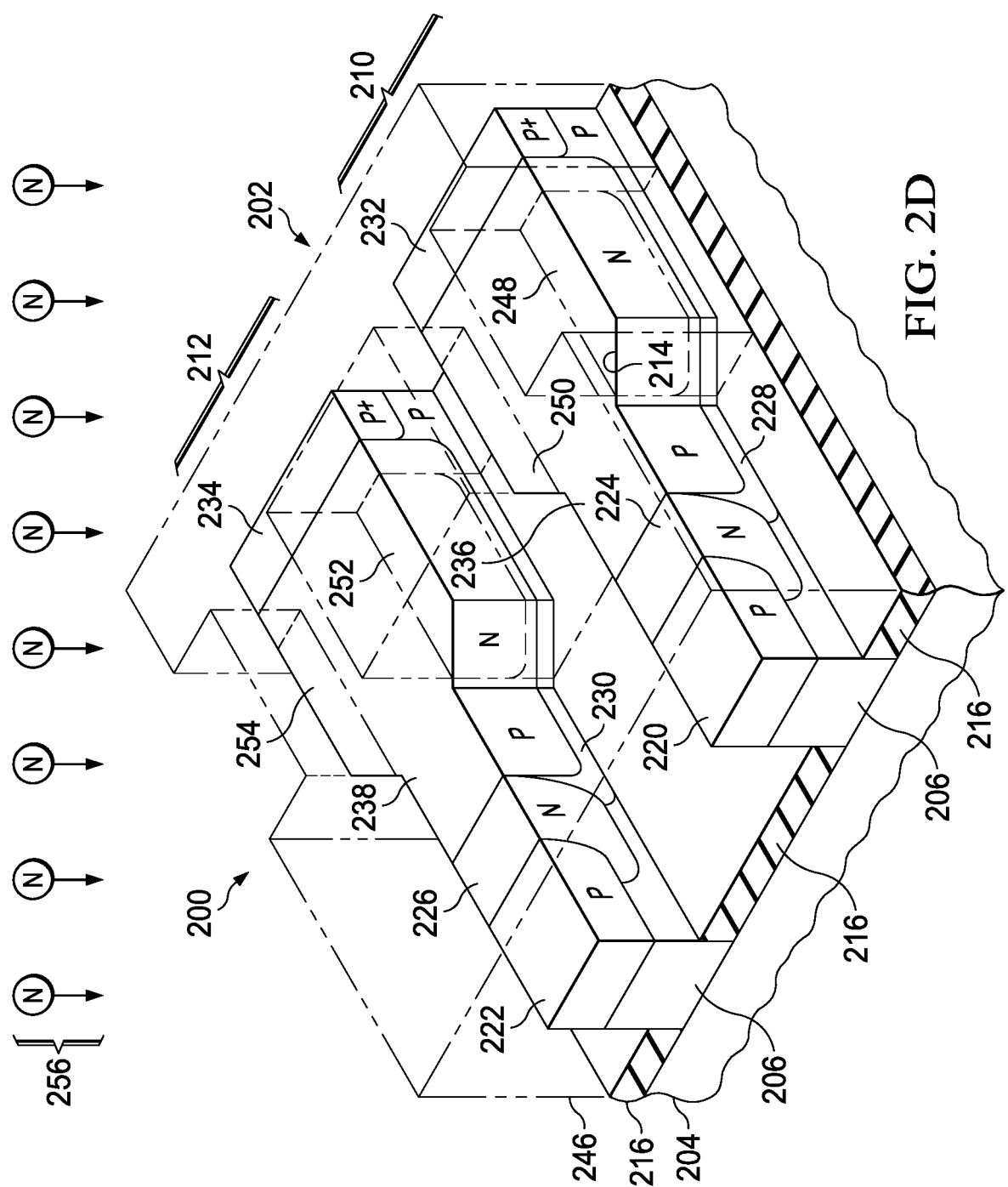

Referring to FIG. 2D, a charge balance mask 246 is formed over the substrate 204. The charge balance mask 246 exposes the substrate 204 in an area for a first charge balance region 248, shown in FIG. 2E, and in an area for a second charge balance region 250, shown in FIG. 2E, in the first fin 210, and in an area for a third charge balance region 252, shown in FIG. 2E, and in an area for a fourth charge balance region 254, shown in FIG. 2E, in the second fin 212. The area for the first charge balance region 248 and the area for the second charge balance region 250 are on opposite sides of the first drain drift region 228 of FIG. 2E. Similarly, the area for the third charge balance region 252 and the area for the fourth charge balance region 254 are on opposite sides of the second drain drift region 230 of FIG. 2E. In this example, the charge balance mask 246 may expose the areas for the second charge balance region 250 and the area for the third charge balance region 252 in a single overlapping exposure zone, which may advantageously provide greater process latitude for the process used to form the charge balance mask 246, compared to a mask with discrete exposed areas. The charge balance mask 246 may have a composition similar to the drift region mask 258 of FIG. 2C, and may be formed by a process similar to that used to form the drift region mask 258.

Second conductivity type dopants 256, for example phosphorus in this example, are implanted into the first fin 210 and the second fin 212 where exposed by the charge balance mask 246, namely, the areas for the charge balance regions 248, 250, 252, and 254. In this example, the second conductivity type dopants 256 may be implanted at a total dose that is 165 percent to 250 percent of the total dose of the first conductivity type dopants 260 of FIG. 2C, so as to counterdope the first conductivity type dopants 260 to provide a net average dopant density in the charge balance regions 248, 250, 252, and 254 that is 65 percent to 150 percent of net average dopant density in the first enhanced portion 236 of the first drain drift region 228 and the second enhanced portion 238 of the second drain drift region 230. The second conductivity type dopants 256 may be implanted at more than one implant energy to distribute the second conductivity type dopants 256 vertically in the first fin 210 and the second fin 212.

The charge balance mask 246 is removed after the second conductivity type dopants 256 are implanted. The charge balance mask 246 may be removed by a process as disclosed in reference to removal of the drift region mask 258 of FIG. 2C.

In an alternate version of this example, the first conductivity type dopants 260 may be implanted after the second conductivity type dopants 256 of FIG. 2C.

Figure 2E:
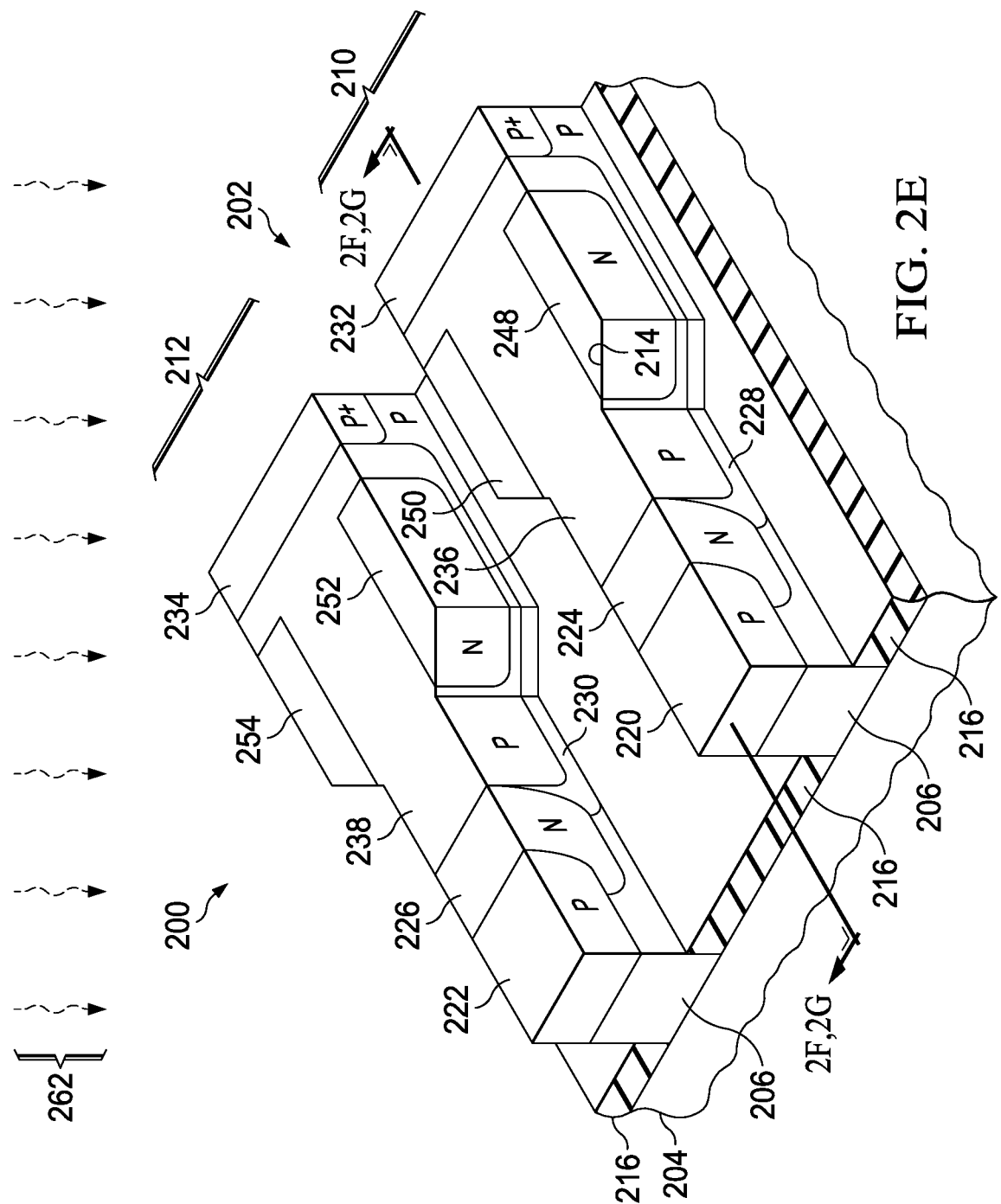

Referring to FIG. 2E, the substrate 204 is heated by an anneal process 262 which activates the first conductivity type dopants 260 of FIG. 2C and activates the second conductivity type dopants 256 of FIG. 2D. In this example, the activated first conductivity type dopants 260 form the first enhanced portion 236 of the first drain drift region 228 in the first drain drift region 228 and form the second enhanced portion 238 of the second drain drift region 230 in the second drain drift region 230, and extend into the first charge balance region 248 and the second charge balance region 250, and extend into the third charge balance region 252 and the fourth charge balance region 254. The activated second conductivity type dopants 256 counterdope the activated first conductivity type dopants 260 to form the first charge balance region 248 and the second charge balance region 250 in the first fin 210, and form the third charge balance region 252 and the fourth charge balance region 254 in the second fin 212. The anneal process 262 may be implemented as a rapid thermal anneal, a spike anneal, or a flash anneal, by way of example.

The first charge balance region 248 is adjacent to, and abuts, the first enhanced portion 236 of the first drain drift region 228 between the first body 224 and the first drain contact region 232, and the second charge balance region 250 is adjacent to, and abuts, the first enhanced portion 236 of the first drain drift region 228 between the first body 224 and the first drain contact region 232, on an opposite side of the first enhanced portion 236 of the first drain drift region 228 from the first charge balance region 248. Similarly, the third charge balance region 252 is adjacent to, and abuts, the second enhanced portion 238 of the second drain drift region 230 between the second body 226 and the second drain contact region 234, and the fourth charge balance region 254 is adjacent to, and abuts, the second enhanced portion 238 of the second drain drift region 230 between the second body 226 and the second drain contact region 234, on an opposite side of the second enhanced portion 238 of the second drain drift region 230 from the third charge balance region 252. Having the first charge balance region 248 and the second charge balance region 250 adjacent to, and on opposite sides of, the first enhanced portion 236 of the first drain drift region 228, and similarly for the third charge balance region 252 and the fourth charge balance region 254 with respect to the second enhanced portion 238 of the second drain drift region 230, may advantageously enable a higher operating potential applied to the first drain contact region 232 compared to a similar finFET that does not have the charge balance regions.

Figure 2F:
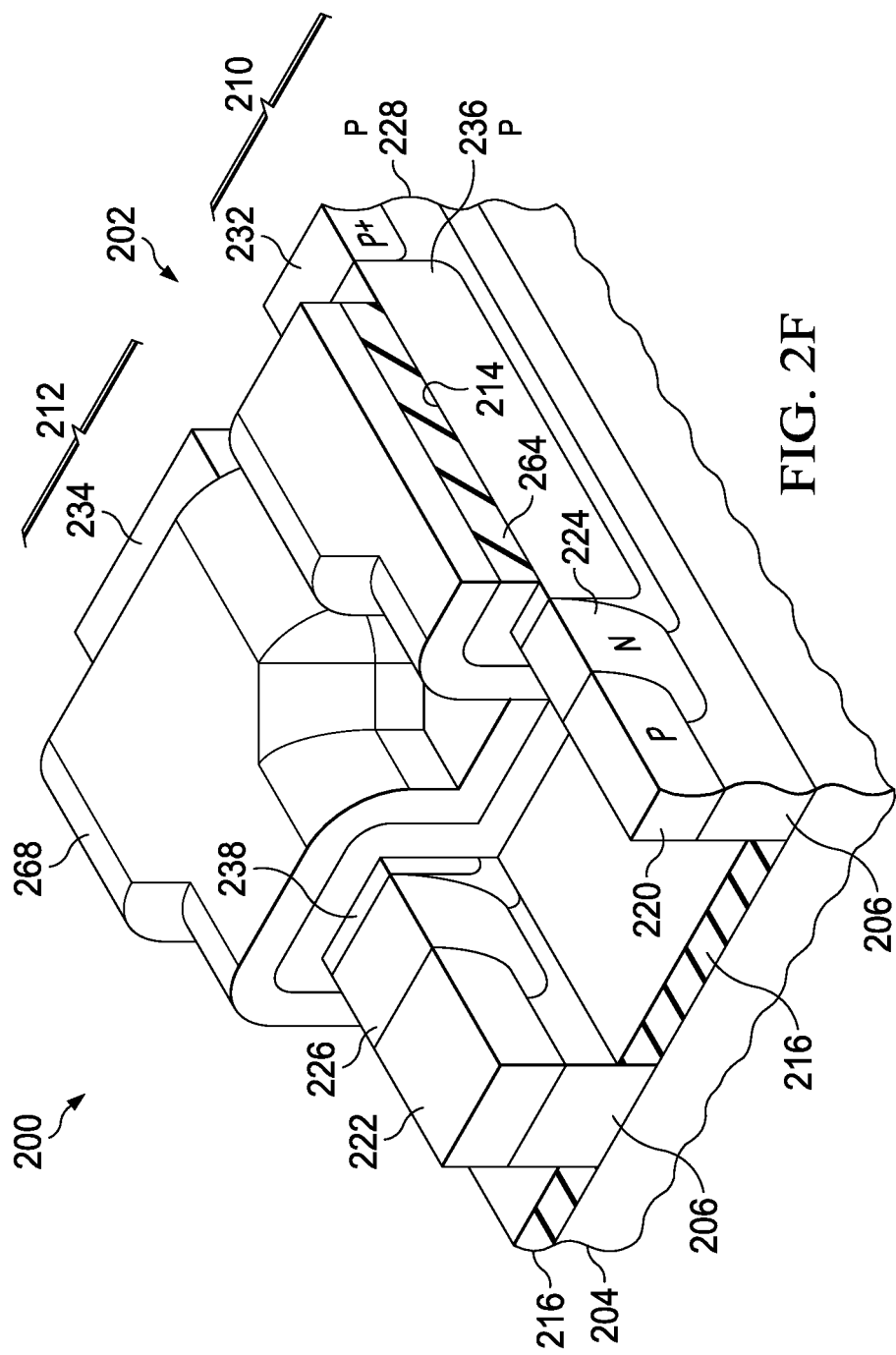
Figure 2G:
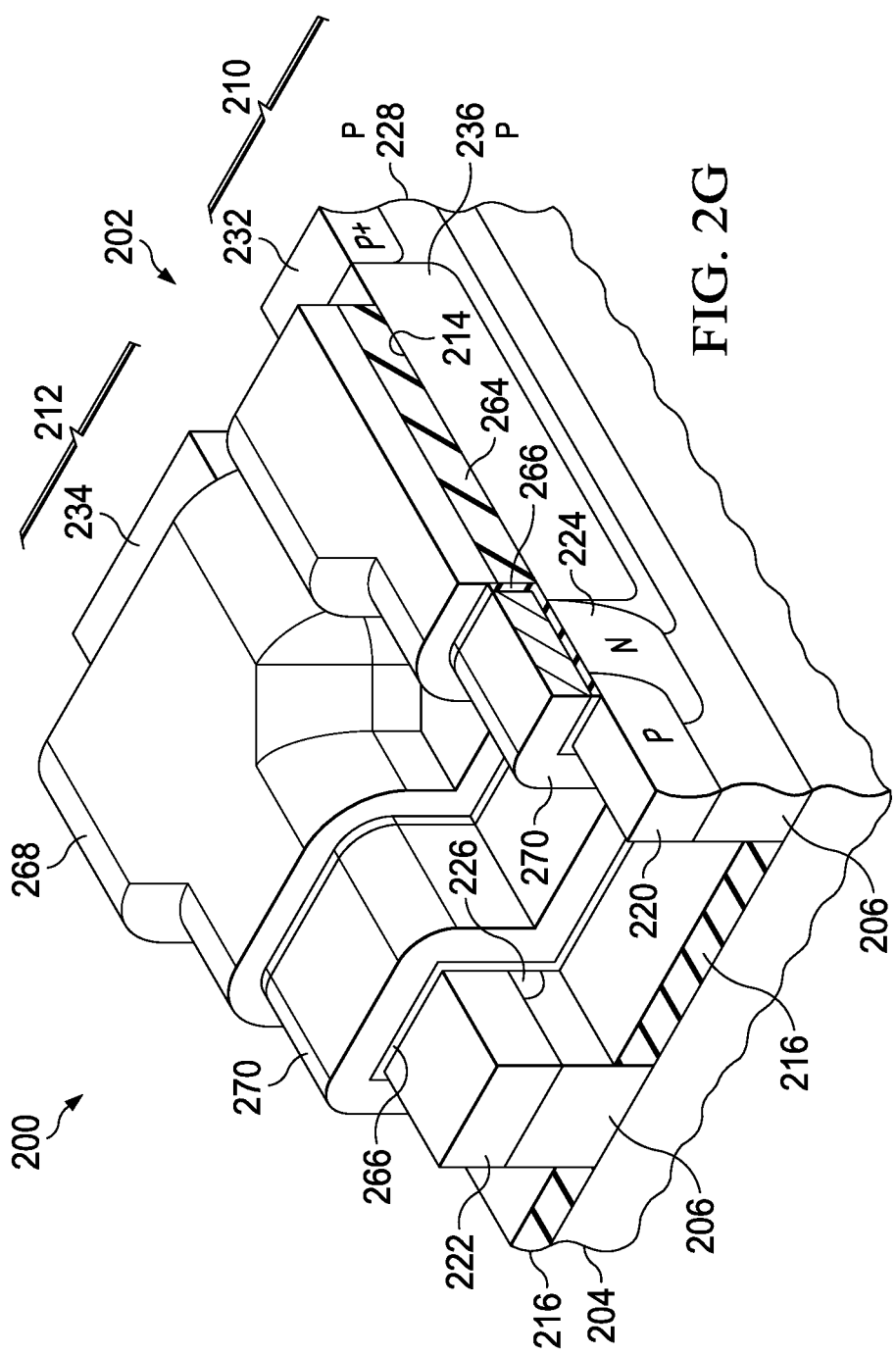

FIG. 2F and FIG. 2G are cut-away views of the semiconductor device 200 along the cut line shown in FIG. 2E, depicting further stages of formation. Referring to FIG. 2F, a field plate dielectric layer 264 is formed over the substrate 204, extending from proximate to the first body 224 toward the first drain contact region 232, and extending from proximate to the second body 226 toward the second drain contact region 234, at least partially overlapping the first enhanced portion 236 of the first drain drift region 228, and at least partially overlapping the second enhanced portion 238 of the second drain drift region 230 of FIG. 2E, obscured in FIG. 2F. The field plate dielectric layer 264 may also at least partially overlap the first charge balance region 248 of FIG. 2E, cut away in FIG. 2F, and the second charge balance region 250, the third charge balance region 252, and the fourth charge balance region 254, of FIG. 2E, obscured in FIG. 2F. The field plate dielectric layer 264 may have properties similar to the field plate dielectric layer 164 of FIG. 1F, and may be formed by similar processes.

A field plate 268 is formed over the field plate dielectric layer 264. The field plate 268 may include polysilicon with a layer of metal silicide on the polysilicon, or may include other electrically conductive materials, such as aluminum, copper, titanium, titanium nitride, tantalum, or tantalum nitride. The field plate 268 may be formed by forming a layer of field plate material over the field plate dielectric layer 264 forming a field plate mask over the layer of field plate material, and removing the layer of field plate material where exposed by the field plate mask.

Referring to FIG. 2G, a gate dielectric layer 266 is formed on the first body 224, and on the second body 226. The gate dielectric layer 266 extends onto the top surface 214 of the first fin 210 and the second fin 212, over the first body 224 and the second body 226, and on two lateral surfaces each of the first body 224 and the second body 226, the lateral surfaces extending from the top surface 214 to the recess oxide 216. The gate dielectric layer 266 may include any of the materials, and may be formed by any of the processes, disclosed in reference to the gate dielectric layer 166 of FIG. 1F. The gate dielectric layer 266 may have a thickness of 2 nanometers to 12 nanometers, by way of example.

A gate 270 is formed over the gate dielectric layer 266. The gate 270 extends across the top surface 214 on the first body 224 and the second body 226, and over the lateral surfaces of the first body 224 and the second body 226. In this example, the field plate 268 may be separate from the gate 270. The gate 270 may include any of the materials, and may be formed by any of the processes, disclosed in reference to the gate 170 of FIG. 1F.

The field plate 268 may be biased independently of the gate 270 in this example, to advantageously reduce an electric field in the first enhanced portion 236 of the first drain drift region 228 and the second enhanced portion 238 of the second drain drift region 230 of FIG. 2E, obscured in FIG. 2G, during operation of the finFET 202. Having the field plate 268 separate from the gate 270 may enable operating the finFET 202 at a higher potential than a comparable finFET with a continuous gate and field plate.

Various features of the examples disclosed herein may be combined in other manifestations of example semiconductor devices. For example, in the finFET 102, the drain contact regions 132 and 134 may be segmented. In the finFET 202, the drain contact regions 232 and 234 may be continuous. In the finFET 102, the gate 170 and the field plate 168 may be separated. In the finFET 202, the gate 270 and the field plate 268 may be continuous. In the finFET 102, the fins 110 and 112 may be formed by an epitaxial process. In the finFET 202, the fins 210 and 212 may be formed by an etch process. In the finFET 102, the charge balance regions 148, 150, 152, and 154 may be counterdoped. In the finFET 202, the charge balance regions 248, 250, 252, and 254 may be implanted with one conductivity type dopants. In the finFET 102 and the finFET 202, the enhanced portions 136 and 138 of the drain drift regions 128 and 130, and the enhanced portions 236 and 238 of the drain drift regions 228 and 230, may be counterdoped. The finFET 102 may be a p-channel finFET. The finFET 202 may be an n-channel finFET.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A semiconductor device, comprising:
    a substrate; and
    a fin field effect transistor (finFET) on the substrate, the finFET including:
        a fin of a semiconductor material on the substrate;
        a source in the fin, the source having a first conductivity type;
        a body in the fin abutting the source, the body having a second conductivity type, opposite from the first conductivity type;
        a drain drift region in the fin, the drain drift region abutting the body, opposite from the source, the drain drift region having the first conductivity type, wherein the drain drift region is wider than the body, the drain drift region including an enhanced portion of the drain drift region, the enhanced portion of the drain drift region having a higher net average first conductivity type dopant concentration than a remainder of the drain drift region;
        a first charge balance region in the fin, laterally adjacent to, and abutting, the enhanced portion of the drain drift region, the first charge balance region having the second conductivity type;
        a second charge balance region in the fin, laterally adjacent to, and abutting, the enhanced portion of the drain drift region, opposite from the first charge balance region, the second charge balance region having the second conductivity type;
        a drain contact region in the fin adjacent to the drain drift region, opposite from the body, the drain contact region having the first conductivity type;
        a gate dielectric layer on the body, over a top surface of the fin and extending on two lateral surfaces of the body; and
        a gate over the gate dielectric layer, the gate extending over the top surface of the fin and extending over the two lateral surfaces of the body.

2. The semiconductor device of claim 1, wherein the enhanced portion of the drain drift region has a net average first conductivity type dopant concentration of $1 \times 10^{16}$ cm$^{-3}$ to $4 \times 10^{16}$ cm$^{-3}$.

3. The semiconductor device of claim 1, wherein the first charge balance region and the second charge balance region each have net average second conductivity type dopant concentrations of 65 percent to 150 percent of a net average first conductivity type dopant concentration of in the enhanced portion of the drain drift region.

4. The semiconductor device of claim 1, wherein the enhanced portion of the drain drift region has a length of 200 nanometers to 1 micron between the body and the drain contact region.

5. The semiconductor device of claim 1, wherein the body is 100 nanometers to 300 nanometers wide.

6. The semiconductor device of claim 1, wherein the enhanced portion of the drain drift region is 200 nanometers to 400 nanometers wider than the body.

7. The semiconductor device of claim 1, wherein the fin extends 300 nanometers to 800 nanometers above the substrate.

8. The semiconductor device of claim 1, wherein the finFET further includes a field plate at least partially overlapping the enhanced portion of the drain drift region.

9. The semiconductor device of claim 8, wherein the field plate is continuous with gate.

10. The semiconductor device of claim 1, wherein:
    the fin is a first fin;
    the source is a first source;
    the body is a first body;
    the drain drift region is a first drain drift region;
    the enhanced portion of the first drain drift region is a first enhanced portion of the first drain drift region;
    the drain contact region is a first drain contact region; and
    the finFET further includes:
        a second fin of the semiconductor material on the substrate;
        a second source in the second fin, the second source having the first conductivity type;
        a second body in the second fin abutting the second source, the second body having the second conductivity type; and
        a second drain drift region in the second fin, the second drain drift region abutting the second body, opposite from the second source, the second drain drift region having the first conductivity type, wherein the second drain drift region is wider than the second body, the second drain drift region including a second enhanced portion of the second drain drift region, the second enhanced portion of the second drain drift region having a higher net average first conductivity type dopant concentration than a remainder of the second drain drift region;
        a third charge balance region in the fin, laterally adjacent to, and abutting, the second enhanced portion of the second drain drift region, the third charge balance region having the second conductivity type;

a fourth charge balance region in the fin, laterally adjacent to, and abutting, the second enhanced portion of the second drain drift region, opposite from the third charge balance region, the fourth charge balance region having the second conductivity type; and a second drain contact region in the second fin adjacent to the second enhanced portion of the second drain drift region, opposite from the second body, the second drain contact region having the first conductivity type;

wherein the gate dielectric layer extends onto the second body, over a top surface of the second fin and extending on two lateral surfaces of the second body; and the gate extends over the top surface of the second fin, over the second body and over the two lateral surfaces of the second body.

11. The semiconductor device of claim 10, wherein the second drain contact region is continuous with the first drain contact region.

12. A method of forming a semiconductor device, comprising:

providing a substrate;

forming a fin of a semiconductor material on the substrate;

forming a source in the fin, the source having a first conductivity type;

forming a body in the fin abutting the source, the body having a second conductivity type, opposite from the first conductivity type;

forming a drain drift region in the fin, the drain drift region having the first conductivity type, the drain drift region being wider than the body;

forming a drain contact region in the drain drift region, the drain contact region having the first conductivity type;

forming an enhanced portion of the drain drift region in the drain drift region between the body and the drain contact region, the enhanced portion of the drain drift region having the first conductivity type, the enhanced portion of the drain drift region having a higher net average first conductivity type dopant concentration than a remainder of the drain drift region;

forming a first charge balance region in the fin adjacent to the enhanced portion of the drain drift region between the body and the drain contact region, the first charge balance region having the second conductivity type;

forming a second charge balance region in the fin adjacent to the enhanced portion of the drain drift region between the body and the drain contact region, opposite from the first charge balance region, the second charge balance region having the second conductivity type;

forming a gate dielectric layer on the body, over a top surface of the fin and extending on two lateral surfaces of the body; and forming a gate over the gate dielectric layer, the gate extending over the top surface of the fin on the body and extending over the two lateral surfaces of the body.

13. The method of claim 12, wherein forming the enhanced portion of the drain drift region includes implanting first conductivity type dopants into the drain drift region at a total dose of $5 \times 10^{11}$ cm$^{-2}$ to $3 \times 10^{12}$ cm$^{-2}$.

14. The method of claim 12, wherein forming the first charge balance region and the second charge balance region includes implanting second conductivity type dopants into the fin at a total dose of 65 percent to 150 percent of a total dose of first conductivity type dopants implanted in the drain drift region to form the enhanced portion of the drain drift region.

15. The method of claim 12, wherein the enhanced portion of the drain drift region is formed to have a length of 200 nanometers to 1 micron between the body and the drain contact region.

16. The method of claim 12, wherein the body is formed to be 100 nanometers to 300 nanometers wide.

17. The method of claim 12, wherein the enhanced portion of the drain drift region is formed to be 200 nanometers to 400 nanometers wider than the body.

18. The method of claim 12, wherein the fin is formed to extend 300 nanometers to 800 nanometers above the substrate.

19. The method of claim 12, wherein:

the fin is a first fin;

the source is a first source;

the body is a first body;

the drain drift region is a first drain drift region;

the drain contact region is a first drain contact region; and the enhanced portion of the first drain drift region is a first enhanced portion of the first drain drift region; and further comprising:

forming a second fin of the semiconductor material on the substrate;

forming a second source in the second fin, the second source having the first conductivity type;

forming a second body in the second fin abutting the second source, the second body having the second conductivity type;

forming a second drain drift region in the second fin, the second drain drift region abutting the second body, opposite from the second source, the second drain drift region having the first conductivity type, wherein the second drain drift region is wider than the second body;

forming a second drain contact region in the second drain drift region, the second drain contact region having the first conductivity type;

forming a second enhanced portion of the drain drift region in the second drain drift region abutting the second body, opposite from the second source, the second enhanced portion of the drain drift region having the first conductivity type, the second enhanced portion of the second drain drift region having a higher net average first conductivity type dopant concentration than a remainder of the second drain drift region;

forming a third charge balance region in the second fin adjacent to the second enhanced portion of the drain drift region between the second body and the second drain contact region, the third charge balance region having the second conductivity type;

forming a fourth charge balance region in the second fin adjacent to the second enhanced portion of the drain drift region between the second body and the second drain contact region, opposite from the third charge balance region, the fourth charge balance region having the second conductivity type;

forming the gate dielectric layer to extend onto the second body, over a top surface of the second fin on the second body and extending on two lateral surfaces of the second body; and forming the gate to extend over the top surface of the second fin and extending over the two lateral surfaces of the second body.

20. The method of claim 19, wherein the second drain contact region is formed to be continuous with the first drain contact region.

* * * * *